· US010606775B1

(12) United States Patent
Murphy et al.

(10) Patent No.: US 10,606,775 B1
(45) Date of Patent: Mar. 31, 2020

(54) COMPUTING TILE

(71) Applicant: Micron Technology, Inc., Boise, ID (US)

(72) Inventors: Richard C. Murphy, Boise, ID (US); Glen E. Hush, Boise, ID (US); Vijay S. Ramesh, Boise, ID (US); Allan Porterfield, Durham, NC (US); Anton Korzh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/236,188

(22) Filed: Dec. 28, 2018

(51) Int. Cl.
*G06F 13/16* (2006.01)
*G06F 15/78* (2006.01)

(52) U.S. Cl.
CPC ...... *G06F 13/1668* (2013.01); *G06F 15/7839* (2013.01)

(58) Field of Classification Search
None
See application file for complete search history.

(56) References Cited

U.S. PATENT DOCUMENTS

| | | | |
|---|---|---|---|
| 5,668,809 A * | 9/1997 | Rostoker | H04L 12/5601 370/392 |
| 5,999,936 A * | 12/1999 | Pattison | G06F 16/24561 |
| 6,310,652 B1 * | 10/2001 | Li | G10L 21/04 348/515 |
| 8,438,455 B2 | 5/2013 | Vogan et al. | |
| 9,449,035 B2 | 9/2016 | Grossman et al. | |
| 9,477,295 B2 | 10/2016 | Jreji et al. | |
| 9,484,103 B1 | 11/2016 | Bruce et al. | |
| 10,496,621 B2 * | 12/2019 | Oks | G06F 16/215 |
| 2003/0152148 A1 * | 8/2003 | Laksono | H04N 21/44026 375/240.24 |
| 2004/0213157 A1 * | 10/2004 | Karlsson | H04L 12/5601 370/235 |
| 2008/0294676 A1 * | 11/2008 | Faerber | H03M 7/30 |
| 2009/0055005 A1 * | 2/2009 | Oxman | G10L 19/16 700/94 |
| 2010/0017649 A1 | 1/2010 | Wu et al. | |
| 2010/0299316 A1 * | 11/2010 | Faerber | H03M 7/3084 707/693 |
| 2013/0262409 A1 * | 10/2013 | Amit | G06F 3/0608 707/693 |

(Continued)

Primary Examiner — Michael Sun
(74) Attorney, Agent, or Firm — Brooks, Cameron & Huebsch, PLLC

(57) ABSTRACT

Systems, apparatuses, and methods related to a computing tile are described. The computing tile may perform operations on received data to extract some of the received data. The computing tile may perform operations without intervening commands. The computing tile may perform operations on data streamed through the computing tile to extract relevant data from data received by the computing tile. In an example, the computing tile is configured to receive a command to initiate an operation to reduce a size of a block of data from a first size to a second size. The computing tile can then receive a block of data from a memory device coupled to the apparatus. The computing tile can then perform an operation on the block of data to extract predetermined data from the block of data to reduce a size of the block of data from a first size to a second size.

27 Claims, 9 Drawing Sheets

(56) References Cited

U.S. PATENT DOCUMENTS

| | | | |
|---|---|---|---|
| 2014/0198652 A1* | 7/2014 | Dalal | G06F 13/16 370/235 |
| 2015/0120959 A1* | 4/2015 | Bennett | H04L 47/10 709/233 |
| 2015/0371684 A1 | 12/2015 | Mataya | |
| 2018/0300840 A1* | 10/2018 | Ray | G06T 15/005 |
| 2018/0307606 A1* | 10/2018 | Ray | G06F 12/0844 |

* cited by examiner

US 10,606,775 B1

COMPUTING TILE

TECHNICAL FIELD

The present disclosure relates generally to semiconductor memory and methods, and more particularly, to apparatuses, systems, and methods for a computing tile.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
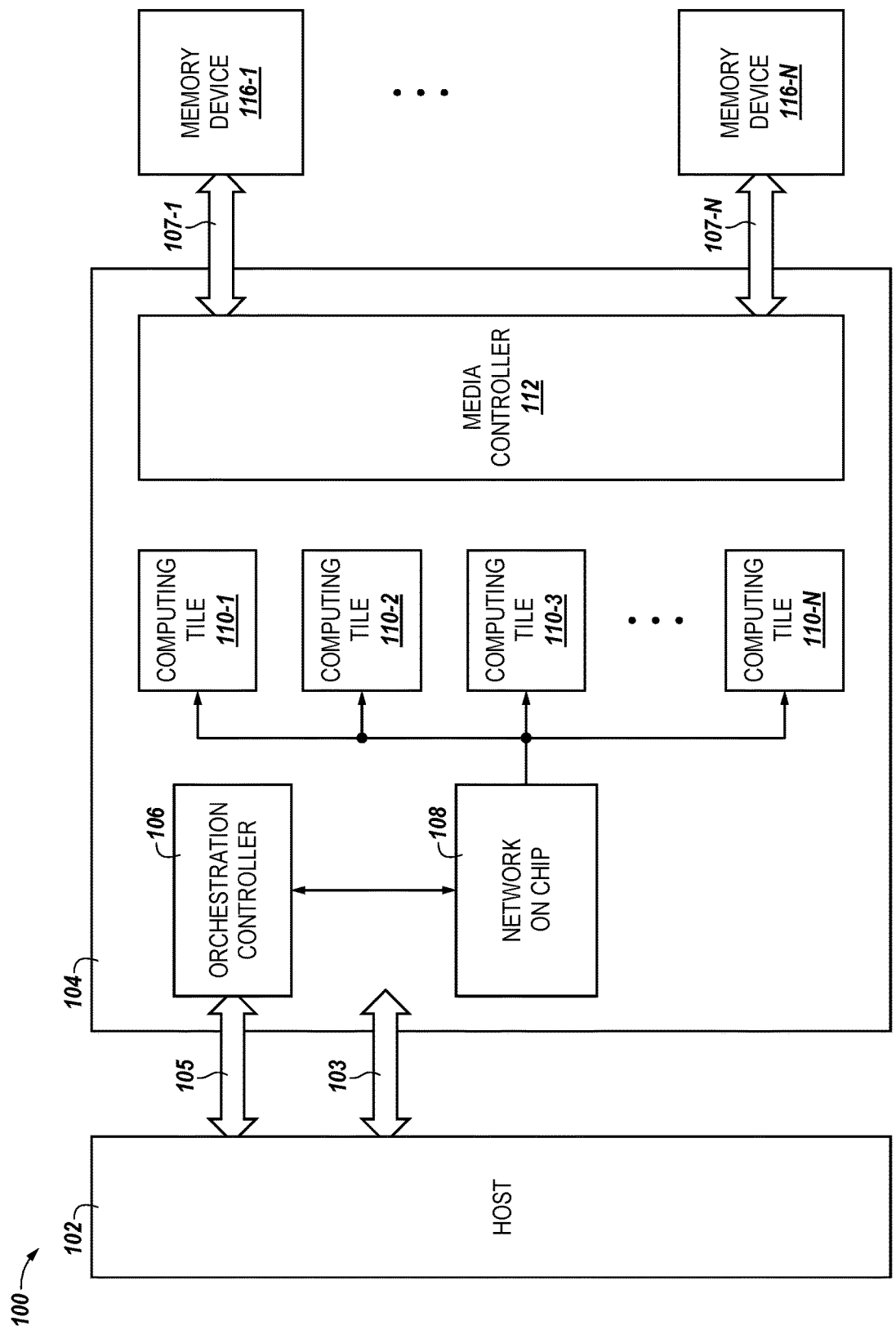
FIG. 1 is a functional block diagram in the form of a computing system including an apparatus including a storage controller and a number of memory devices in accordance with a number of embodiments of the present disclosure.

The present disclosure includes apparatuses, systems, and methods for a computing tile. An example apparatus includes a computing tile comprising a processing device and a memory resource. The computing tile is configured to receive a command to initiate an operation to reduce a size of a block of data from a first size to a second size. Responsive to receipt of the command, the computing tile can receive a block of data from a memory device coupled to the apparatus. Responsive to receipt of the block of data, the computing tile can perform an operation on the block of data to extract predetermined data from the block of data to reduce a size of the block of data from a first size to a second size.

Memory devices may be used to store important or critical data in a computing device and can transfer such data between a host associated with the computing device. However, as the size and quantity of data stored by memory devices increases, transferring the data to and from the host can become time consuming and resource intensive. For example, when a host requests large blocks of data from a memory device, an amount of time and/or an amount of resources consumed in obliging the request can increase in proportion to the size and/or quantity of data associated with the blocks of data.

As storage capability of memory devices increases, these effects can become more pronounced as more and more data are able to be stored by the memory device and are therefore available to be transferred to or from the host. In addition, blocks of requested data can include data that is not relevant or needed by the host. For example, in some approaches, irrelevant data may be transferred to the host with a block of data that includes relevant data. This can lead to a need for further processing on the host end to extract the relevant data from the block of data, which can incur additional processing time and/or consume additional processing resources.

For example, in some approaches, when a block of data that includes a large quantity of information such as a block of data that includes multiple columns of information, all of the information included in the block of data may be transferred to the host despite the host desiring only certain columns of data included in the block of data. In the case of large blocks of data, the processing time and/or resource consumption associated with processing the blocks of data to extract relevant information can become excessive, thereby reducing the efficacy of the host or computing device.

As a non-limiting example, the host may request specific data that is stored in a database by a memory device. The host may only be interested in the first two columns of data from the database but not the third column of data. In some approaches, the memory device may transfer all three columns of data to the host and the host may perform additional processing on the data to obtain only the relevant first two columns. In such examples, additional time, bandwidth, and/or processing resources may be consumed not only in transferring an entire column of data to the host that the host is not going to use, but also in host operations to remove the irrelevant data (e.g., the third column in this example).

In contrast, embodiments herein allow for the relevant data to be extracted from a block of data by a storage controller (e.g., by circuitry coupled to or provided on the memory device) prior to transfer of the data to the host. For example, embodiments herein can allow for operations, such as filtering operations, in which an amount of data to be transferred to the host is reduced prior to transfer of said data to the host, to be performed on blocks of data prior to the data being transferred to the host. In relation to the above non-limiting example, this can allow for the host to receive only the first two columns of data (e.g., the relevant data) instead of the relevant data and the irrelevant data. This can allow for a reduction in time, bandwidth, and/or processing resources consumed not only in transferring irrelevant data to the host, but also can reduce time, bandwidth, and/or processing resources consumed by host operations to remove the irrelevant data in comparison to some approaches.

Similarly, embodiments herein allow for the relevant data to be extracted from a block of data by a storage controller (e.g., by circuitry coupled to or provided on the memory device) prior to transfer of the data to a memory device coupled to the storage controller. For example, embodiments herein can allow for operations, such as filtering operations, in which an amount of data to be transferred to the memory device(s) is reduced prior to transfer of said data to the memory device(s), to be performed on blocks of data prior to the data being transferred to the memory device(s).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X," "Y," "N," "M," "A," "B," "C," "D," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 104 may reference element "04" in FIG. 1, and a similar element may be referenced as 204 in FIG. 2. A group or plurality of similar elements or components may generally be referred to herein with a single element number. For example, a plurality of reference elements 110-1, 110-2, . . . , 110-N may be referred to generally as 110. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a storage controller 104 and a number of memory devices 116-1, . . . , 116-N in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, memory devices 116-1 . . . 116-N can include a one or more memory modules (e.g., single in-line memory modules, dual in-line memory modules, etc.). The memory devices 116-1, . . . , 116-N can include volatile memory and/or non-volatile memory. In a number of embodiments, memory devices 116-1, . . . , 116-N can include a multi-chip device. A multi-chip device can include a number of different memory types and/or memory modules. For example, a memory system can include non-volatile or volatile memory on any type of a module.

The memory devices 116-1, . . . , 116-N can provide main memory for the computing system 100 or could be used as additional memory or storage throughout the computing system 100. Each memory device 116-1, . . . , 116-N can include one or more arrays of memory cells, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

In embodiments in which the memory devices 116-1, . . . , 116-N include non-volatile memory, the memory devices 116-1, . . . , 116-N can be flash memory devices such as NAND or NOR flash memory devices. Embodiments are not so limited, however, and the memory devices 116-1, . . . , 116-N can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof.

As illustrated in FIG. 1, a host 102 can be coupled to a storage controller 104, which can in turn be coupled to the memory devices 116-1 . . . 116-N. In a number of embodiments, each memory device 116-1 . . . 116-N can be coupled to the storage controller 104 via a channel (e.g., channels 107-1, . . . , 107-N). In FIG. 1, the storage controller 104, which includes an orchestration controller 106, is coupled to the host 102 via channel 103 and the orchestration controller 106 is coupled to the host 102 via a channel 105. The host 102 can be a host system such as a personal laptop computer, a desktop computer, a digital camera, a smart phone, a memory card reader, and/or internet-of-thing enabled device, among various other types of hosts, and can include a memory access device, e.g., a processor (or processing device). One of ordinary skill in the art will appreciate that "a processor" can intend one or more processors, such as a parallel processing system, a number of coprocessors, etc.

The host 102 can include a system motherboard and/or backplane and can include a number of processing resources (e.g., one or more processors, microprocessors, or some other type of controlling circuitry). The system 100 can include separate integrated circuits or the host 102, the storage controller 104, the orchestration controller 106, the network-on-chip (NoC) 108, and/or the memory devices 116-1, . . . , 116-N can be on the same integrated circuit. The system 100 can be, for instance, a server system and/or a high performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

The storage controller 104 can include an orchestration controller 106, a network on a chip (NoC) 108, a plurality of computing tiles 110-1, . . . , 110-N, which are described in more detail in connection with FIGS. 5 and 6, herein, and a media controller 112. The orchestration controller 106 can include circuitry and/or logic configured to allocate and de-allocate resources to the computing tiles 110-1, . . . , 110-N during performance of operations described herein. In some embodiments, the orchestration controller 106 can be an application specific integrated circuit (ASIC), a field programmable gate array (FPGA), or other combination of circuitry and/or logic configured to orchestrate operations performed by the computing tiles 110-1, . . . , 110-N. For example, the orchestration controller 106 can include circuitry and/or logic to control the computing tiles 110-1, . . . , , 110-N to perform operations on blocks of received data to reduce an amount of data included in the block of data.

The orchestration controller 106 can be configured to request a block of data from one or more of the memory devices 116-1, . . . , 116-N and cause the computing tiles 110-1, . . . , 110-N to perform an operation (e.g., a filtering operation) on the block of data. The operation may be performed to reduce a total amount of data (e.g., a number of bits of data) associated with the block of data. The orchestration controller 104 can be further configured to cause the block of data that has been operated on (e.g., a filtered block of data) to be transferred to an interface (e.g., communication paths 103 and/or 105) and/or the host 102.

In some embodiments, the orchestration controller 106 can be one of the plurality of computing tiles 110. For example, the orchestration controller 106 can include the same or similar circuitry that the computing tiles 110-1, . . . , 110-N include, as described in more detail in connection with FIG. 4B, herein. However, in some embodiments, the orchestration controller 106 can be a distinct or separate component from the computing tiles 110-1, . . . , 110-N, and may therefore include different circuitry than the computing tiles 110, as shown in FIG. 1.

The NoC 108 can be a communication subsystem that allows for communication between the orchestration controller 106 and the computing tiles 110-1, . . . , 110-N. The NoC 108 can include circuitry and/or logic to facilitate the communication between the orchestration controller 106 and the computing tiles 110-1, . . . , 110-N. In some embodiments, as described in more detail in connection with FIG. 2, herein, the NoC 108 can receive an output from the computing tiles 110-1, . . . , 110-N and transfer the output from the computing tiles 110-1, . . . , 110-N to the orchestration controller 106 and/or the host 102, and vice versa. For example, the NoC 108 may be configured to receive data that has been subjected to a filtering operation by the computing tiles 110-1, . . . , 110-N and transfer the filtered data to the orchestration controller 106 and/or the host 102. In some embodiments, as described in more detail in connection with FIG. 4B, herein, the NoC 108 can include at least a portion of the orchestration controller 106. For example, the NoC 108 can include the circuitry that comprises the orchestration controller 106, or a portion thereof.

Although a NoC 108 is shown in FIG. 1, embodiments are not limited to utilization of a NoC 108 to provide a communication path between the orchestration controller 106 and the computing tiles 110-1, . . . , 110-N. For example, other communication paths such as a storage controller crossbar (XBAR) may be used to facilitate communication between the computing tiles 110-1, . . . , 110-N and the orchestration controller 106.

The media controller 112 can be a "standard" or "dumb" media controller. For example, the media controller 112 can be configured to perform simple operations such as copy, write, read, error correct, etc. for the memory devices 116-1, . . . , 116-N. However, in some embodiments, the media controller 112 does not perform processing (e.g., operations to manipulate data) on data associated with the memory devices 116-1, . . . , 116-N. For example, the media controller 112 can cause a read and/or write operation to be performed to read or write data from or to the memory devices 116-1, . . . , 116-N via the communication paths 107-1, . . . , 107-N, but the media controller 112 may not perform processing on the data read from or written to the memory devices 116-1, . . . , 116-N. In some embodiments, the media controller 112 can be a non-volatile media controller, although embodiments are not so limited.

The embodiment of FIG. 1 can include additional circuitry that is not illustrated so as not to obscure embodiments of the present disclosure. For example, the storage controller 104 can include address circuitry to latch address signals provided over I/O connections through I/O circuitry. Address signals can be received and decoded by a row decoder and a column decoder to access the memory devices 116-1, . . . , 116-N. It will be appreciated by those skilled in the art that the number of address input connections can depend on the density and architecture of the memory devices 116-1, . . . , 116-N.

Figure 2:
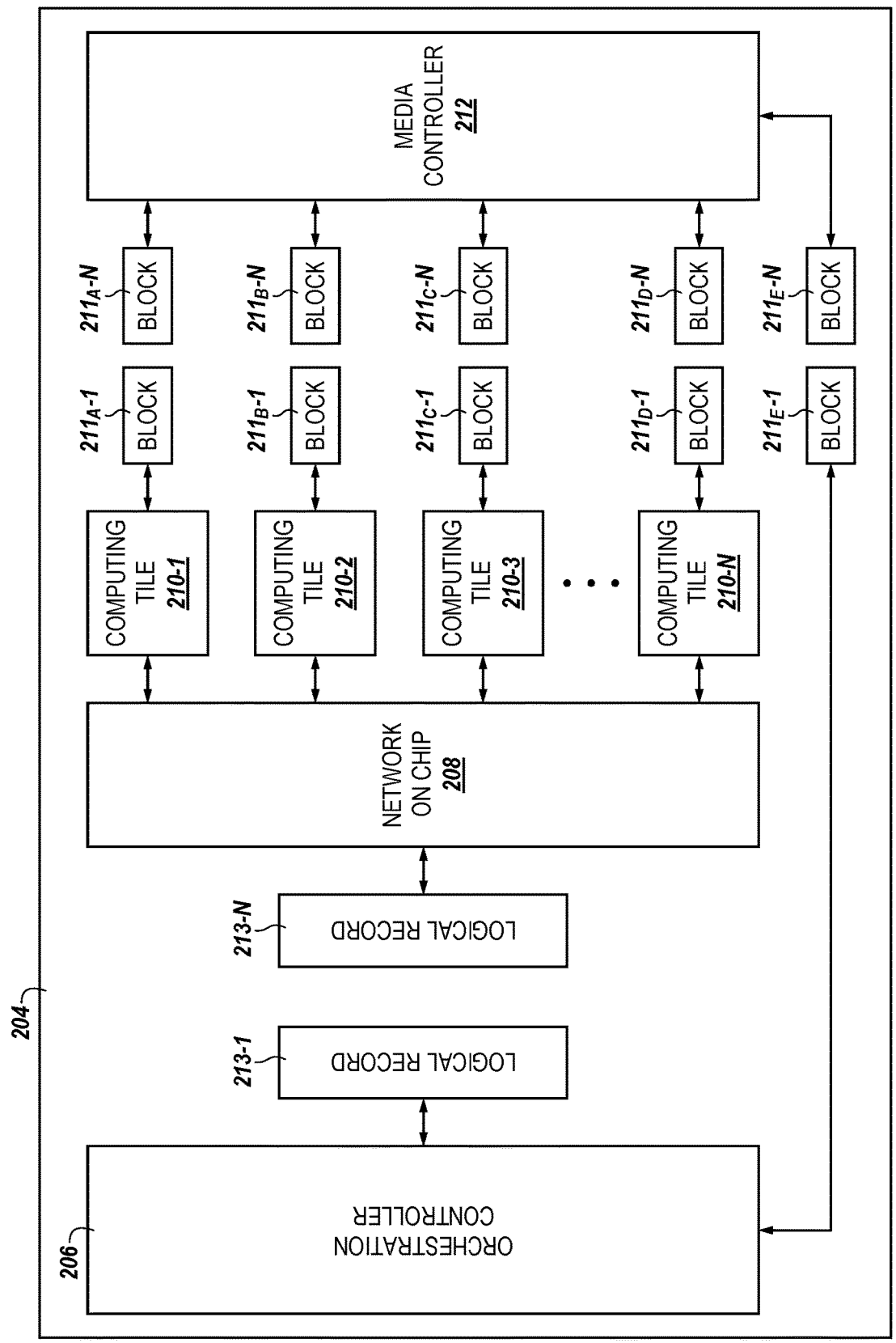
FIG. 2 is a functional block diagram in the form of an apparatus including a storage controller in accordance with a number of embodiments of the present disclosure.

FIG. 2 is a functional block diagram in the form of an apparatus including a storage controller 204 in accordance with a number of embodiments of the present disclosure. The storage controller 204 can be analogous to the storage controller 104 illustrated in FIG. 1. As shown in FIG. 2, the storage controller 204 can include a media controller 212, a plurality of computing tiles 210-1, . . . , 210-N, a network on chip (NoC) 208, and an orchestration controller 206.

The media controller 212 can be configured to retrieve blocks of data $211_A$-1, . . . , $211_A$-N, $211_B$-1, . . . , $211_B$-N, $211_C$-1, . . . , $211_C$-N, $211_D$-1, . . . , $211_D$-N, $211_E$-1, . . . , $211_E$-N from a memory device (e.g., memory device(s) 116-1, . . . , 116-N illustrated in FIG. 1) coupled to the storage controller 204 in response to a request from the orchestration controller 206. The media controller can subsequently cause the blocks of data $211_A$-1, . . . , $211_A$-N, $211_B$-1, . . . , $211_B$-N, $211_C$-1, . . . , $211_C$-N, $211_D$-1, . . . , $211_D$-N, $211_E$-1, . . . , $211_E$-N to be transferred to the computing tiles 210-1, . . . , 210-N and/or the orchestration controller 206.

Similarly, the media controller 212 can be configured to receive blocks of data $211_A$-1, . . . , $211_A$-N, $211_B$-1, . . . , $211_B$-N, $211_C$-1, . . . , $211_C$-N, $211_D$-1, . . . , $211_D$-N, $211_E$-1, . . . , $211_E$-N from the computing tiles 210 and/or the orchestration controller 206. The media controller can subsequently cause the blocks of data $211_A$-1, ..., $211_A$-N, $211_B$-1, ..., $211_B$-N, $211_C$-1, ..., $211_C$-N, $211_D$-1, ..., $211_D$-N, $211_E$-1, ..., $211_E$-N to be transferred to a memory device coupled to the storage controller 204.

The blocks of data 211 can be approximately 4 kilobytes in size (although embodiments are not limited to this particular size) and can be processed in a streaming manner by the computing tiles 210-1, ..., 210-N in response to one or more commands generated by the orchestration controller 206. For example, as described in more detail in connection with FIGS. 5 and 6, herein, because the computing tiles 210 can process a second block of data 211 in response to completion of a process on a preceding block of data 211, the blocks of data 211 can be continuously streamed through the computing tiles 210 while the blocks of data 211 are being processed by the computing tiles 210. In some embodiments, the blocks of data 211 can be processed in a streaming fashion through the computing tiles 210 in the absence of an intervening command from the orchestration controller 206. That is, in some embodiments, the orchestration controller 206 can issue a command to cause the computing tiles 210 to process blocks of data 211 received thereto and blocks of data 211 that are subsequently received by the computing tiles 210 can be processed in the absence of an additional command from the orchestration controller 206.

In some embodiments, processing the blocks 211 of data can include reducing a size and/or quantity of data associated with the blocks of data 211. For example, the computing tiles 210-1, ..., 211-N can, in response to commands from the orchestration controller 206, perform filtering operations on the blocks of data 211 to remove unwanted data, extract relevant data, or otherwise parse the blocks of data 211 to reduce a size or quantity of data associated therewith.

In a non-limiting example, the blocks of data 211 can include one or more comma-separated value (CSV) files. If particular strings or particular data are desired from the CSV file(s), the orchestration controller 206 can send a command to the computing tiles 210 to cause the computing tiles 210 to receive blocks of data 211 containing the CSV files from, for example, a memory device coupled to the storage controller 204. The computing tiles 210 can perform operations on the CSV file(s) to extract the relevant information, as described in more detail in connection with FIG. 5, herein, and subsequently transfer the relevant data out of the computing tiles 210 to circuitry external to the computing tiles 210 (e.g., to the orchestration controller 204, the NoC 208, and/or a host, such as the host 102 illustrated in FIG. 1, herein).

In another non-limiting example in which two columns of data A and B are requested from a block of data (e.g., the block of data $211_A$-1) containing three columns of data A, B, and C, the block of data containing all three columns can be transferred to the computing tiles 210 in response to a command from the orchestration controller 206. The computing tiles 210 can selectively process the block of data to extract the relevant columns (e.g., column A and column B) from the block of data, and can subsequently transfer the filtered data out of the computing tiles 210 to circuitry external to the computing tiles 210 (e.g., to the orchestration controller 206, the NoC 208, and/or a host, such as the host 102 illustrated in FIG. 1, herein).

The orchestration controller 206 can be further configured to send commands to the computing tiles 210-1, ..., 210-N to allocate and/or de-allocate resources available to the computing tiles 210-1, ..., 210-N for use in processing the blocks of data 211. In some embodiments, allocating and/or de-allocating resources available to the computing tiles 210-1, ..., 210-N can include selectively enabling some of the computing tiles 210 while selectively disabling some of the computing tiles 210. For example, if less than a total number of computing tiles 210 are required to process the blocks of data 211, the orchestration controller 206 can send a command to the computing tiles 210 that are to be used for processing the blocks of data 211 to enable only those computing tiles 210 desired to process the blocks of data 211.

The orchestration controller 206 can, in some embodiments, be further configured to send commands to synchronize performance of operations performed by the computing tiles 210. For example, the orchestration can send a command to a first computing tile (e.g., the computing tile 210-1) to cause the first computing tile to perform a first operation, and the orchestration controller 206 can send a command to a second computing tile (e.g., the computing tile 210-2) to perform a second operation using the second computing tile. Synchronization of performance of operations performed by the computing tiles 210 by the orchestration controller 206 can further include causing the computing tiles 210 to perform particular operations at particular time or in a particular order.

In some embodiments, the filtered blocks of data can be converted into logical records 213-1, ..., 213-N subsequent to processing of the blocks of data 211 by the computing tiles 210. The logical records 213 can comprise data records that are independent of their physical locations. For example, the logical records 213 may be data records that point to a location in at least one of the computing tiles 210 where physical data corresponding to the processed (e.g., the filtered) block of data is stored.

As described in more detail in connection with FIGS. 5 and 6, herein, the processed or filtered block of data 211 can be stored in a partition of a computing tile memory (e.g., the computing tile memory 538 illustrated in FIG. 5 or the computing tile memory 638 illustrated in FIG. 6) that is different than a partition in which the block of data is stored prior to processing as part of the operation to process or filter the block of data to extract relevant data or otherwise reduce a size or quantity of bits associated with the block of data. In some embodiments, the logical records 213 can point to that location such that the processed or filtered data can be accessed from the computing tiles 210 and transferred to circuitry external to the computing tiles 210.

In some embodiments, the orchestration controller 206 can receive and/or send blocks of data $211_E$-1, ..., $211_E$-N directly to and from the media controller 212. This can allow the orchestration controller 206 to transfer blocks of data $211_E$-1, ..., $211_E$-N that are not processed by the computing tiles 210 to and from the media controller 212.

For example, if the orchestration controller 206 receives unprocessed blocks of data $211_E$-1, ..., $211_E$-N from a host (e.g., the host 102 illustrated in FIG. 1) coupled to the storage controller 204 that are to be stored by memory device(s) (e.g., the memory devices 116 illustrated in FIG. 1) coupled to the storage controller 204, the orchestration controller 206 can cause the unprocessed blocks of data $211_E$-1, ..., $211_E$-N to be transferred to the media controller 212, which can, in turn, cause the unprocessed blocks of data $211_E$-1, ..., $211_E$-N to be transferred to memory device(s) coupled to the storage controller 204.

Similarly, if the host requests an unprocessed (e.g., a full) block of data (e.g., a block of data that is not processed by the computing tiles 210), the media controller 212 can cause full blocks of data $211_E$-1, ..., $211_E$-N to be transferred to the orchestration controller 206, which can subsequently transfer the unprocessed blocks of data $211_E$-1, . . . , $211_E$-N to the host.

Figure 3:
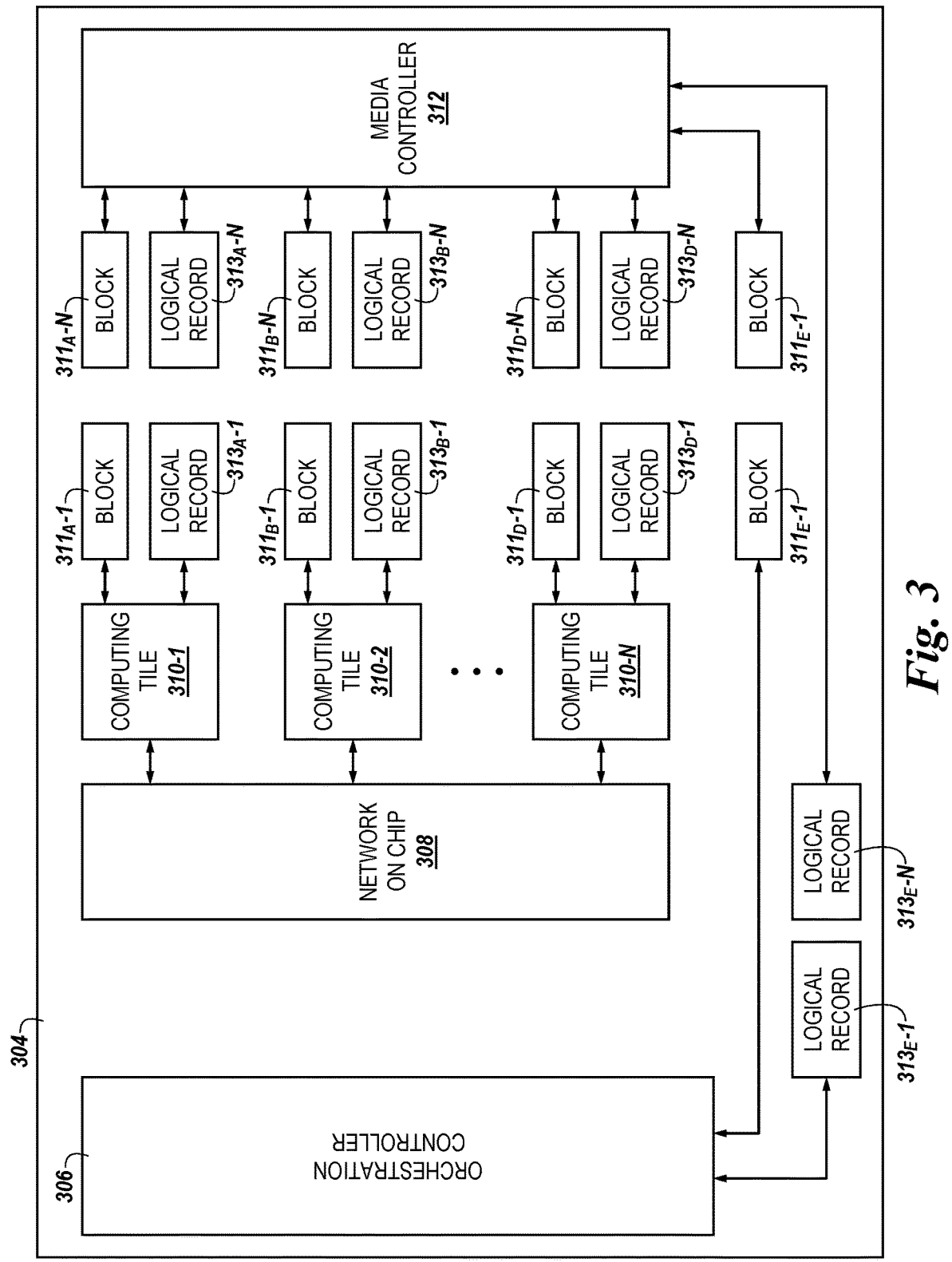
FIG. 3 is another functional block diagram in the form of an apparatus including a storage controller in accordance with a number of embodiments of the present disclosure.

FIG. 3 is another functional block diagram in the form of an apparatus including a storage controller 304 in accordance with a number of embodiments of the present disclosure. The storage controller 304 can be analogous to the storage controller 104 illustrated in FIG. 1 or the storage controller 204 illustrated in FIG. 2, herein. As shown in FIG. 3, the storage controller 304 can include a media controller 312, a plurality of computing tiles 310-1, . . . , 310-N, a network on chip (NoC) 308, and an orchestration controller 306.

The media controller 312 can be configured to retrieve blocks of data $311_A$-1, . . . , $311_A$-N, $311_B$-1, . . . , $311_B$-N, $311_C$-1, . . . , $311_C$-N, $311_D$-1, . . . , $311_D$-N, $311_E$-1, . . . , $311_E$-N and/or logical records $313_A$-1, . . . , $313_A$-N, $313_B$-1, . . . , $313_B$-N, $313_C$-1, . . . , $313_C$-N, $313_D$-1, . . . , $313_D$-N, $313_E$-1, . . . , $313_E$-N from a memory device (e.g., memory device(s) 116-1, . . . , 116-N illustrated in FIG. 1) coupled to the storage controller 304 in response to a request from the orchestration controller 306. The media controller can subsequently cause the blocks of data $311_A$-1, . . . , $311_A$-N, $311_B$-1, . . . , $311_B$-N, $311_C$-1, . . . , $311_C$-N, $311_D$-1, . . . , $311_D$-N, $311_E$-1, . . . , $311_E$-N and/or logical records $313_A$-1, . . . , $313_A$-N, $313_B$-1, . . . , $313_B$-N, $313_C$-1, . . . , $313_C$-N, $313_D$-1, . . . , $313_D$-N, $313_E$-1, . . . , $313_E$-N to be transferred to the computing tiles 310-1, . . . , 310-N and/or the orchestration controller 306.

Similarly, the media controller 312 can be configured to receive blocks of data $311_A$-1, . . . , $311_A$-N, $311_B$-1, . . . , $311_B$-N, $311_C$-1, . . . , $311_C$-N, $311_D$-1, . . . , $311_D$-N, $311_E$-1, . . . , $311_E$-N and/or logical records $313_A$-1, . . . , $313_A$-N, $313_B$-1, . . . , $313_B$-N, $313_C$-1, . . . , $313_C$-N, $313_D$-1, . . . , $313_D$-N, $313_E$-1, . . . , $313_E$-N from the computing tiles 310 and/or the orchestration controller 306. The media controller can subsequently cause the blocks of data $311_A$-1, . . . , $311_A$-N, $311_B$-1, . . . , $311_B$-N, $311_C$-1, . . . , $311_C$-N, $311_D$-1, . . . , $311_D$-N, $311_E$-1, . . . , $311_E$-N and/or logical records $313_A$-1, . . . , $313_A$-N, $313_B$-1, . . . , $313_B$-N, $313_C$-1, . . . , $313_C$-N, $313_D$-1, . . . , $313_D$-N, $313_E$-1, . . . , $313_E$-N to be transferred to a memory device coupled to the storage controller 304.

The blocks of data 311 can be approximately 4 kilobytes in size and can be processed in a streaming manner by the computing tiles 310-1, . . . , 310-N in response to one or more commands generated by the orchestration controller 306. In some embodiments, processing the blocks 311 of data can include reducing a size and/or quantity of data associated with the blocks of data 311. For example, the computing tiles 310-1, . . . , 310-N can, in response to commands from the orchestration controller 306, perform filtering operations on the blocks of data 311 to remove unwanted data, extract relevant data, or otherwise parse the blocks of data 311 to reduce a size or quantity of data associated therewith. For example, the computing tiles 310-1, . . . , 310-N can, in response to commands from the orchestration controller 306, process blocks of data 311, generate logical records 313, and/or transfer the logical records to a location external to the computing tiles 310.

Figure 4A:
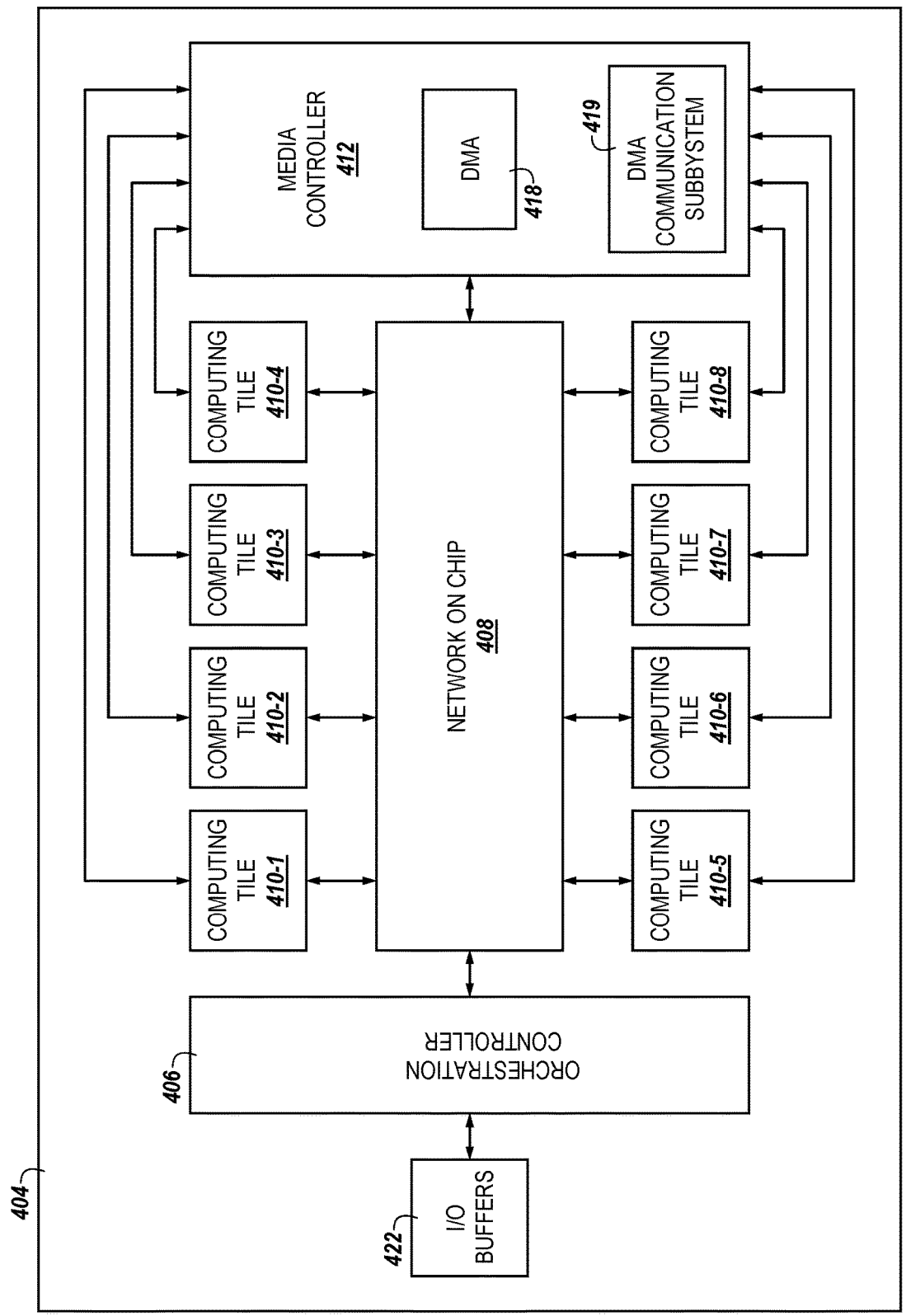
FIG. 4A is yet another functional block diagram in the form of an apparatus including a storage controller in accordance with a number of embodiments of the present disclosure.
Figure 4B:
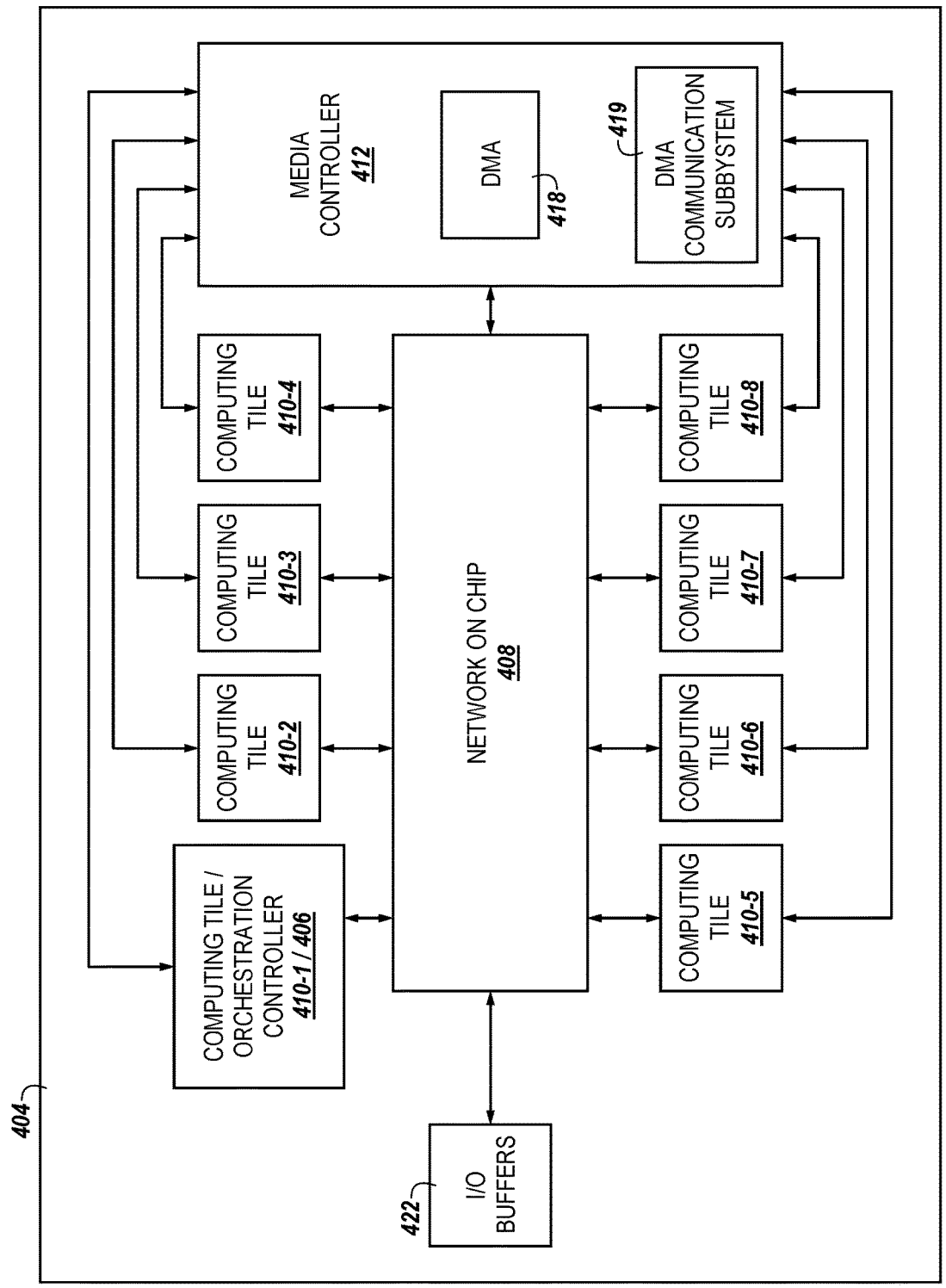
FIG. 4B is yet another functional block diagram in the form of an apparatus including a storage controller in accordance with a number of embodiments of the present disclosure.
Figure 4C:
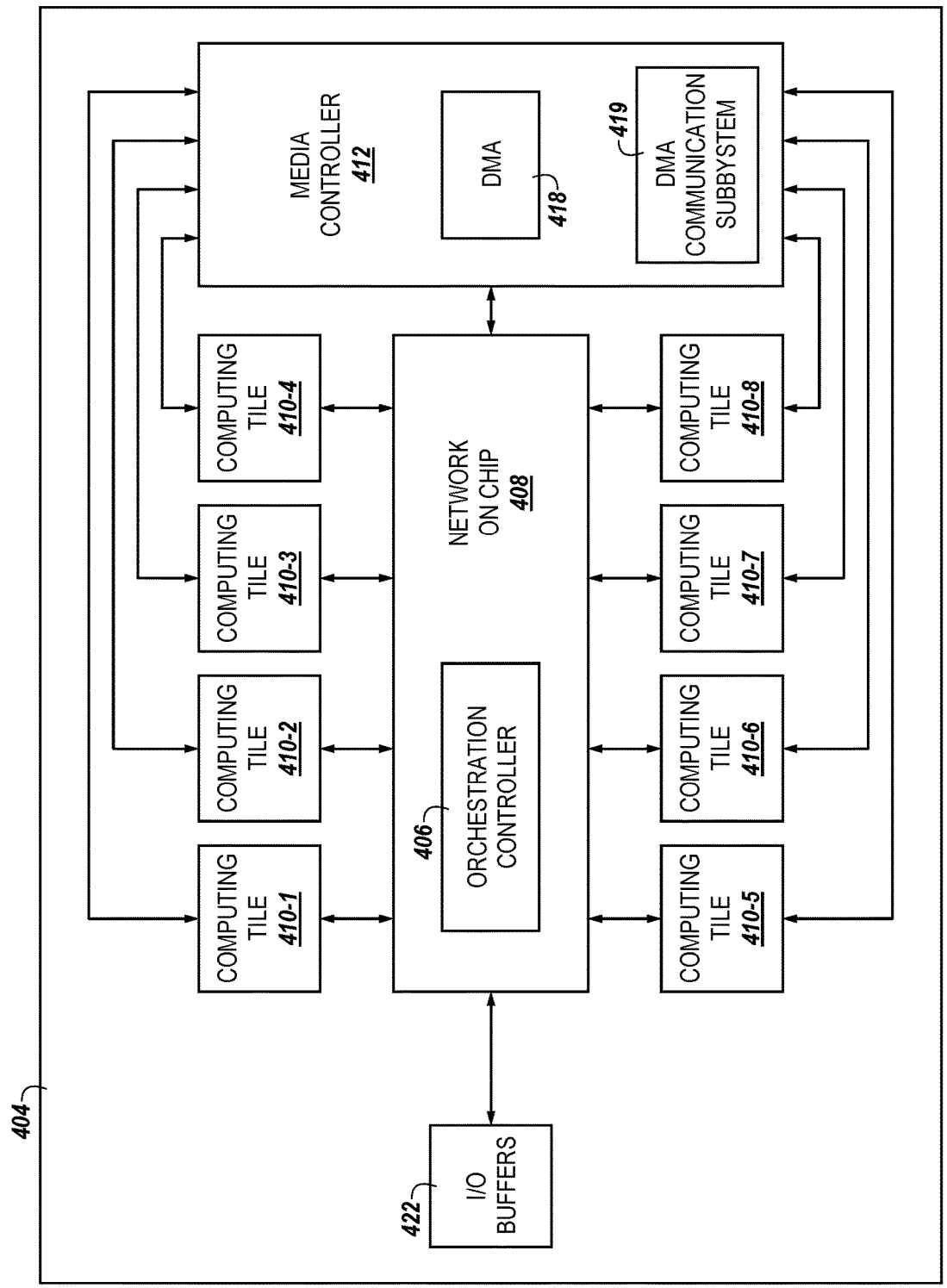
FIG. 4C is yet another functional block diagram in the form of an apparatus including a storage controller in accordance with a number of embodiments of the present disclosure.

FIGS. 4A-4C illustrate various examples of a functional block diagram in the form of an apparatus including a storage controller 404 in accordance with a number of embodiments of the present disclosure. In FIGS. 4A-4C, a media controller 412 is in communication with a plurality of computing tiles 410, a NoC 408, and an orchestration controller 406, which is communication with input/output (I/O) buffers 422. Although eight (8) discrete computing tiles 410 are shown in FIGS. 4A-4C, it will be appreciated that embodiments are not limited to a storage controller 404 that includes eight discrete computing tiles 410. For example, the storage controller 404 can include one or more computing tiles 410, depending on characteristics of the storage controller 404 and/or overall system in which the storage controller 404 is deployed.

As shown in FIGS. 4A-4C, the media controller 412 can include a direct memory access (DMA) component 418 and a DMA communication subsystem 419. The DMA 418 can facilitate communication between the media controller 418 and memory device(s), such as the memory devices 116-1, . . . , 116-N illustrated in FIG. 1, coupled to the storage controller 404 independent of a central processing unit of a host, such as the host 102 illustrated in FIG. 1. The DMA communication subsystem 419 can be a communication subsystem such as a crossbar ("XBAR"), a network on a chip, or other communication subsystem that allows for interconnection and interoperability between the media controller 412, the storage device(s) coupled to the storage controller 404, and/or the computing tiles 410.

In some embodiments, the NoC 408 can facilitate visibility between respective address spaces of the computing tiles 410. For example, each computing tile 410-1, . . . , 8 can, responsive to receipt of a file, store the file in a memory resource (e.g., in the computing tile memory 548 or the computing tile memory 638 illustrated in FIGS. 5 and 6, herein) of the computing tile 410. The computing tiles 410 can associate an address (e.g., a physical address) corresponding to a location in the computing tile 410 memory resource in which the file is stored. In addition, the computing tile 410 can break the address associated with the file into logical blocks.

Figure 5:
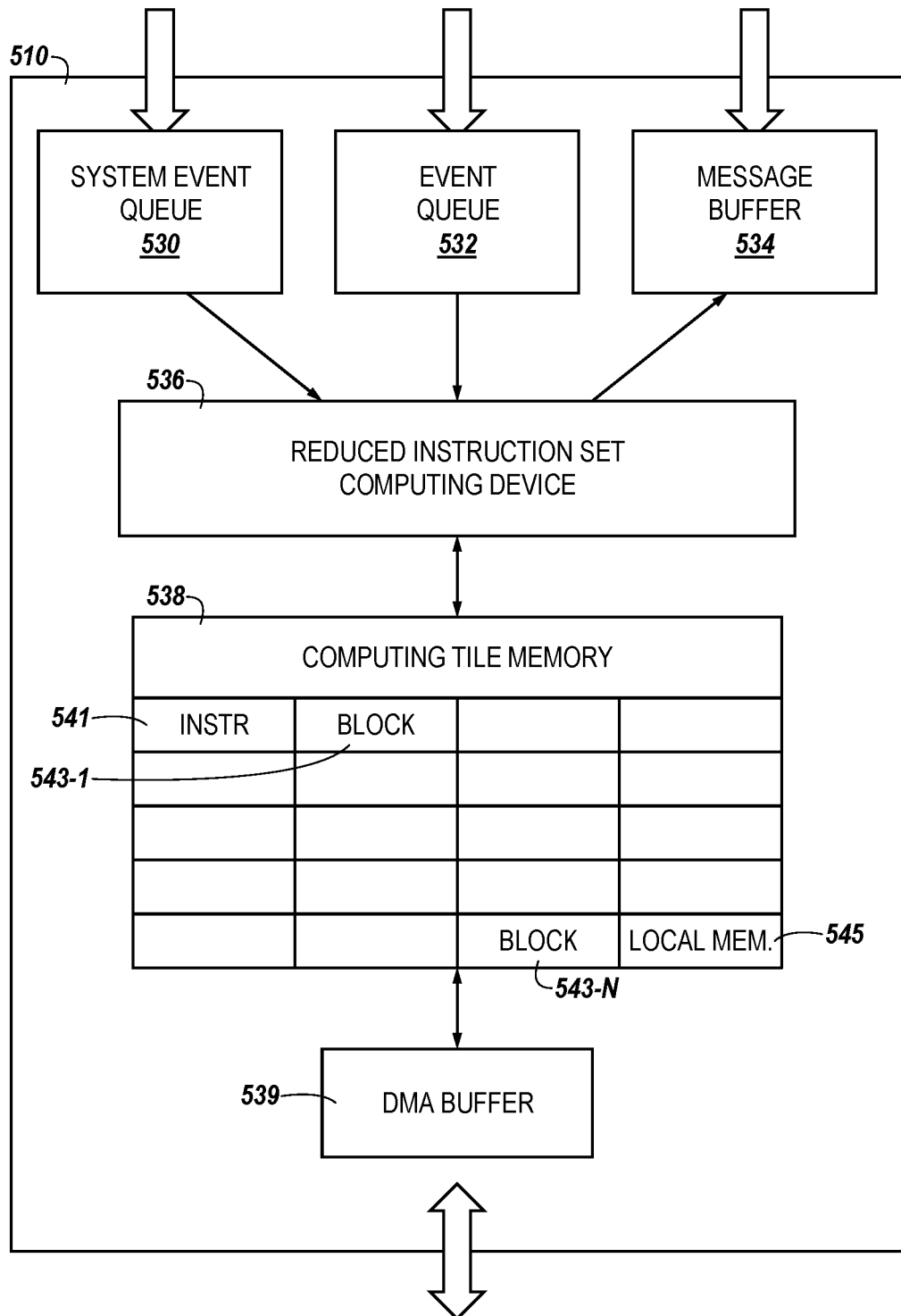
FIG. 5 is a block diagram in the form of a computing tile in accordance with a number of embodiments of the present disclosure.
Figure 6:
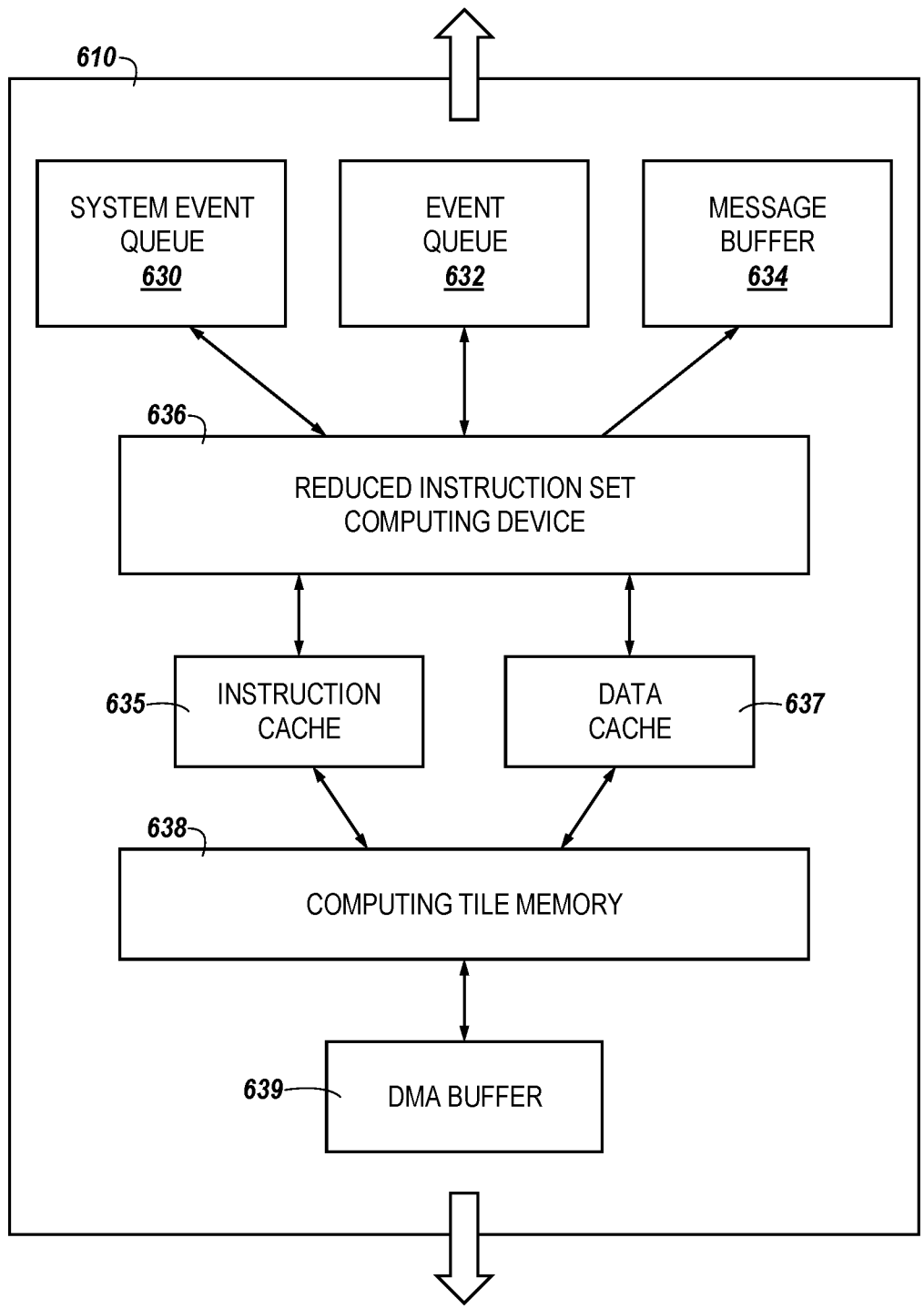
FIG. 6 is another block diagram in the form of a computing tile in accordance with a number of embodiments of the present disclosure.

In some embodiments, the zeroth logical block associated with the file can be transferred to a processing device (e.g., the reduced instruction set computing (RISC) device 536 or the RISC device 636 illustrated in FIGS. 5 and 6, herein). A particular computing tile (e.g., computing tile 410-2) can be configured to recognize that a particular set of logical addresses are accessible to that computing tile 410-2, while other computing tiles (e.g., computing tile 410-3, 410-4, etc.) can be configured to recognize that different sets of logical addresses are accessible to those computing tiles. Stated alternatively, a first computing tile (e.g., the computing tile 410-2) can have access to a first set of logical addresses associated with that computing tile 410-2, and a second computing tile (e.g., the computing tile 410-3) can have access to a second set of logical address associated therewith, etc.

If data corresponding to the second set of logical addresses (e.g., the logical addresses accessible by the second computing tile 410-3) is requested at the first computing tile (e.g., the computing tile 410-2), the NoC 408 can facilitate communication between the first computing tile (e.g., the computing tile 410-2) and the second computing tile (e.g., the computing tile 410-3) to allow the first computing tile (e.g., the computing tile 410-2) to access the data corresponding to the second set of logical addresses (e.g., the set of logical addresses accessible by the second computing tile 410-3). That is, the NoC 408 can facilitate communication between the computing tiles 410 to allows address spaces of the computing tiles 410 to be visible to one another.

In some embodiments, communication between the computing tiles 410 to facilitate address visibility can include receiving, by an event queue (e.g., the event queue 532 and 632 illustrated in FIGS. 5 and 6) of the first computing tile, a message requesting access to the data corresponding to the second set of logical addresses, loading the requested data into a memory resource (e.g., the computing tile memory 538 and 638 illustrated in FIGS. 5 and 6, herein) of the first computing tile, and transferring the requested data to a message buffer (e.g., the message buffer 534 and 634 illustrated in FIGS. 5 and 6, herein). Once the data has been buffered by the message buffer, the data can be transferred to the second computing tile via the NoC 408.

In other embodiments, an application requesting data that is stored in the computing tiles 410 can know which computing tiles 410 include the data requested. In this example, the application can request the data from the relevant computing tile 410 and/or the address may be loaded into multiple computing tiles 410 and accessed by the application requesting the data via the NoC 408.

As shown in FIG. 4A, the orchestration controller 406 comprises discrete circuitry that is physically separate from the NoC 408. The NoC 408 can be a communication subsystem that is provided as one or more integrated circuits that allows communication between the computing tiles 410, the media controller 412, and/or the orchestration controller 406. Non-limiting examples of a NoC 408 can include a XBAR or other communications subsystem that allows for interconnection and/or interoperability of the orchestration controller 406, the computing tiles 410, and/or the media controller 412.

As described above, responsive to receipt of a command generated by the orchestration controller 406 and/or the NoC 408, performance of operations to extract relevant data from blocks of data streamed through the computing tiles 410 can be realized.

As shown in FIG. 4B, the orchestration controller 406 is resident on one of the computing tiles 410-1 among the plurality of computing tiles 410-1, . . . , 410-8. As used herein, the term "resident on" refers to something that is physically located on a particular component. For example, the orchestration controller 406 being "resident on" one of the computing tiles 410 refers to a condition in which the orchestration controller 406 is physically coupled to a particular computing tile. The term "resident on" may be used interchangeably with other terms such as "deployed on" or "located on," herein.

As described above, responsive to receipt of a command generated by the computing tile 410-1/orchestration controller 406 and/or the NoC 408, performance of operations to extract relevant data from blocks of data streamed through the computing tiles 410 can be realized.

As shown in FIG. 4C, the orchestration controller 406 is resident on the NoC 408. In some embodiments, providing the orchestration controller 406 as part of the NoC 408 results in a tight coupling of the orchestration controller 406 and the NoC 408, which can result in reduced time consumption to perform operations using the orchestration controller 406.

As described above, responsive to receipt of a command generated by the orchestration controller 406 and/or the NoC 408, performance of operations to extract relevant data from blocks of data streamed through the computing tiles 410 can be realized.

FIG. 5 is a block diagram in the form of a computing tile 510 in accordance with a number of embodiments of the present disclosure. As shown in FIG. 5, the computing tile 510 can include queuing circuitry, which can include a system event queue 530 and/or an event queue 532, and a message buffer 534 (e.g., outbound buffering circuitry). The computing tile 510 can further include a processing device such as a reduced instruction set computing (RISC) device 536, a computing tile memory 538 portion, and a direct memory access buffer 539 (e.g., inbound buffering circuitry). The RISC device 536 can be a processing resource that can employ a reduced instruction set architecture (ISA) such as a RISC-V ISA, however, embodiments are not limited to RISC-V ISAs and other processing devices and/or ISAs can be used.

The system event queue 530, the event queue 532, and the message buffer 534 can be in communication with an orchestration controller such as the orchestration controller 106, 206, 306, and 406 illustrated in FIGS. 1-4, respectively. In some embodiments, the system event queue 530, the event queue 532, and the message buffer 534 can be in direct communication with the orchestration controller, or the system event queue 530, the event queue 532, and the message buffer 534 can be in communication with a network on a chip such as the NoC 108, 208, and 308 illustrated in FIGS. 1-3, respectively, which can further be in communication with the orchestration controller.

The system event queue 530, the event queue 532, and the message buffer 534 can receive messages and/or commands from the orchestration controller and/or can send messages and/or commands to the orchestration controller to control operation of the computing tile 510 to perform operations on blocks of data (e.g., blocks of data 211 and 311 illustrated in FIGS. 2 and 3, herein) that are processed by the computing tile 510. In some embodiments, the commands and/or messages can include messages and/or commands to allocate or de-allocate resources available to the computing tile 510 during performance of the operations. In addition, the commands and/or messages can include commands and/or messages to synchronize operation of the computing tile 510 with other computing tiles deployed in a storage controller (e.g., the storage controller 104, 204, 304, and 404 illustrated in FIG. 1-4, respectively).

For example, the system event queue 530, the event queue 532, and the message buffer 534 can facilitate communication between the computing tile 510 and the orchestration controller to cause the computing tile 510 to process blocks of data to reduce a size and/or quantity of data associated with the blocks of data. In a non-limiting example, the system event queue 530, the event queue 532, and the message buffer 534 can process commands and/or messages received from the orchestration controller to cause the computing tile 510 to perform a filtering operation on the block of data to selectively remove portions of the data prior to transferring a reduced data object out of the computing tile 510. This can allow for relevant data to be extracted from the block of data prior to the data being transferred to circuitry external to the computing tile 510 such as the orchestration controller, a NoC, or a host (e.g., the host 102 illustrated in FIG. 1, herein).

The system event queue 530 can receive interrupt messages from the orchestration controller or NoC. The interrupt messages can be processed by the system event queue 532 to cause a command or message sent from the orchestration controller or the NoC to be immediately executed. For example, the interrupt message(s) can instruct the system event queue 532 to cause the computing tile 510 to abort operation of pending commands or messages and instead execute a new command or message received from the orchestration controller or the NoC. In some embodiments, the new command or message can involve a command or message to initiate an operation to process, using the computing tile 510, one or more blocks of data to extract relevant information therefrom, or to otherwise decrease a size or amount of data associated with the block of data.

The event queue 532 can receive messages that can be processed serially. For example, the event queue 532 can receive messages and/or commands from the orchestration controller or the NoC and can process the messages received in a serial manner such that the messages are processed in the order in which they are received. Non-limiting examples of messages that can be received and processed by the event queue can include request messages from the orchestration controller and/or the NoC to initiate processing of a block of data (e.g., a remote procedure call on the computing tile 510), request messages from other computing tiles to provide or alter the contents of a particular memory location in the computing tile memory 538 of the computing tile that receives the message request (e.g., messages to initiate remote read or write operations amongst the computing tiles), synchronization message requests from other computing tiles to synchronize processing of blocks of data among the computing tiles, etc.

The message buffer 534 can comprise a buffer region to buffer data to be transferred out of the computing tile 510 to circuitry external to the computing tile 510 such as the orchestration controller, the NoC, and/or the host. In some embodiments, the message buffer 534 can operate in a serial fashion such that data is transferred from the buffer out of the computing tile 510 in the order in which it is received by the message buffer 534. The message buffer 534 can further provide routing control and/or bottleneck control by controlling a rate at which the data is transferred out of the message buffer 534. For example, the message buffer 534 can be configured to transfer data out of the computing tile 510 at a rate that allows the data to be transferred out of the computing tile 510 without creating data bottlenecks or routing issues for the orchestration controller, the NoC, and/or the host.

The RISC device 536 can be in communication with the system event queue 530, the event queue 532, and the message buffer 534 and can handle the commands and/or messages received by the system event queue 530, the event queue 532, and the message buffer 534 to facilitate performance of operations on the blocks of data received by the computing tile 510. For example, the RISC device 536 can include circuitry configured to process commands and/or messages to cause a size or quantity of data associated with a block of data received by the computing tile 510 to be reduced. The RISC device 536 may include a single core or may be a multi-core processor.

The computing tile memory 538 can, in some embodiments, be a memory resource such as random-access memory (e.g., RAM, SRAM, etc.). Embodiments are not so limited, however, and the computing tile memory 538 can include various registers, caches, buffers, and/or memory arrays (e.g., 1T1C, 2T2C, 3T, etc. DRAM arrays). The computing tile memory 538 can be configured to receive blocks of data from, for example, a memory device such as the memory devices 116-1, . . . , 116-N illustrated in FIG. 1, herein. In some embodiments, the computing tile memory 538 can have a size of approximately 256 kilobytes (KB), however, embodiments are not limited to this particular size, and the computing tile memory 538 can have a size greater than, or less than, 256 KB.

The computing tile memory 538 can be partitioned into one or more addressable memory regions. As shown in FIG. 5, the computing tile memory 538 can be partitioned into addressable memory regions so that various types of data can be stored therein. For example, one or more memory regions can store instructions ("INSTR") 541 used by the computing tile memory 538, one or more memory regions can store a block of data 543-1, . . . , 543-N (e.g., a block of data retrieved from the memory device(s)), and/or one or more memory regions can serve as a local memory ("LOCAL MEM.") 545 portion of the computing tile memory 538. Although twenty (20) distinct memory regions are shown in FIG. 5, it will be appreciated that the computing tile memory 538 can be partitioned into any number of distinct memory regions.

As discussed above, the blocks of data can be retrieved from the memory device(s) in response to messages and/or commands generated by the orchestration controller (e.g., the orchestration controller 106, 206, 306, 406 illustrated in FIGS. 1-4, herein). In some embodiments, the commands and/or messages can be processed by a media controller such as the media controller 112, 212, 312, or 412 illustrated in FIGS. 1-4, respectively. Once the blocks of data are received by the computing tile 510, they can be buffered by the DMA buffer 539 and subsequently stored in the computing tile memory 538.

As a result, in some embodiments, the computing tile 510 can provide data driven performance of operations on blocks of data received from the memory device(s). For example, the computing tile 510 can begin performing operations on blocks of data (e.g., operations to reduce a size of the block of data, to extract relevant information from the block of data, to remove irrelevant information from the block of data, etc.) received from the memory device(s) in response to receipt of the block of data.

For example, because of the non-deterministic nature of data transfer from the memory device(s) to the computing tile 510 (e.g., because some blocks of data may take longer to arrive at the computing tile 510 dude to error correction operations performed by a media controller prior to transfer of the block of data to the computing tile 510, etc.), data driven performance of the operations on block of data can improve computing performance in comparison to approaches that do not function in a data driven manner.

In some embodiments, the orchestration controller can send a command or message that is received by the system event queue 530 of the computing tile 510. As described above, the command or message can be an interrupt that instructs the computing tile 510 to request a block of data and perform an operation on the block of data to reduce the size or a quantity of data associated with the block of data. However, the block of data may not immediately be ready to be sent from the memory device to the computing tile 510 due to the non-deterministic nature of data transfers from the memory device(s) to the computing tile 510. However, once the block of data is received by the computing tile 510, the computing tile 510 can immediately begin performing the operation to reduce the size or quantity of data associated with the block of data. Stated alternatively, the computing tile 510 can begin performing operations on the block of data responsive to receipt of the block of data without requiring an additional command or message to cause performance of the operation on the block of data.

In some embodiments, the operation can be performed by selectively moving data around in the computing tile memory 538 to extract relevant data from the block of data or to remove irrelevant data from the block of data. In a non-limiting example in which two columns of data A and B are requested from a block of data corresponding to a database and containing three columns of data A, B, and C, the block of data containing all three columns can be transferred to a first block (e.g., block 543-1) of the computing tile memory 538.

The RISC device 536 can execute instructions to cause the first two columns A and B (e.g., the requested or relevant data) of the block of data containing the three columns to be selectively moved to a different partition of the computing tile memory (e.g., to block 543-N). At this stage, the "filtered" block of data (e.g., block 543-N) that contains only the relevant or requested columns A and B can be transferred to the message buffer 534 to be transferred to circuitry external to the computing tile 510.

As the filtered block of data, which can be referred to as a "resultant block of data," is transferred to the message buffer 534, a subsequent block of data can be transferred from the DMA buffer 539 to the computing tile memory 538 and an operation to reduce a size or quantity of data associated with the subsequent block of data can be initiated in the computing tile memory 538. By having a subsequent block of data buffered into the computing tile 510 prior to completion of the operation on the preceding block of data, blocks of data can be continuously streamed through the computing tile in the absence of additional commands or messages from the orchestration controller to initiate operations on subsequent blocks of data. In addition, by preemptively buffering subsequent blocks of data into the DMA buffer 539, delays due to the non-deterministic nature of data transfer from the memory device(s) to the computing tile 510 can be mitigated as the blocks of data are operated on while being streamed through the computing tile 510.

In another non-limiting example, the block of data can include one or more comma-separated value (CSV) files. If particular strings or particular data are desired from the CSV file, the block of data containing the entire CSV file can be stored in a particular partition (e.g., block 543-1) of the computing tile memory 538. The RISC device 536 can execute instructions to cause the particular strings or particular data (e.g., the requested or relevant data) to be moved to a different partition (e.g., block 543-N) of the computing tile memory 538. At this stage, the "filtered" block of data (e.g., block 543-N) that contains only the relevant or requested strings or data can be transferred to the message buffer 534 to be transferred to circuitry external to the computing tile 510.

As the filtered block of data is transferred to the message buffer 534, a subsequent block of data can be transferred from the DMA buffer 539 to the computing tile memory 538 and an operation to reduce a size or quantity of data associated with the subsequent block of data can be initiated in the computing tile memory 538

When the data (e.g., the data that has been operated on) is to be moved out of the computing tile 510 to circuitry external to the computing tile 510 (e.g., to the NoC, the orchestration controller, and/or the host), the RISC device 536 can send a command and/or a message to the orchestration controller, which can, in turn send a command and/or a message to request the data from the computing tile memory 538.

Responsive to the command and/or message to request the data, the computing tile memory 538 can transfer the data to a desired location (e.g., to the NoC, the orchestration tile, and/or the host). For example, responsive to a command to request the data that has been operated on, the data that has been operated on can be transferred to the message buffer 534 and subsequently transferred out of the computing tile 510. In some embodiments, the data transferred from the computing tile memory 538 to the NoC, the orchestration controller, and/or the host can be data that has had an operation performed thereon to reduce an original size of the data (e.g., to reduce the size of the block of data received by the computing tile 510 from the memory device(s)) by removing irrelevant data from the block of data and/or by extracting relevant data from the block of data.

FIG. 6 is another block diagram in the form of a computing tile 610 in accordance with a number of embodiments of the present disclosure. As shown in FIG. 6, the computing tile 610 can include a system event queue 630, an event queue 632, and a message buffer 634. The computing tile 610 can further include an instruction cache 635, a data cache 637, a processing device such as a reduced instruction set computing (RISC) device 636, a computing tile memory 638 portion, and a direct memory access buffer 639. The computing tile 610 shown in FIG. 6 can be analogous to the computing tile 510 illustrated in FIG. 5, however, the computing tile 610 illustrated in FIG. 6 further includes the instruction cache 635 and/or the data cache 637.

The instruction cache 635 and/or the data cache 637 can be smaller in size than the computing tile memory 638. For example, the computing tile memory can be approximately 256 KB while the instruction cache 635 and/or the data cache 637 can be approximately 32 KB in size. Embodiments are not limited to these particular sizes, however, so long as the instruction cache 635 and/or the data cache 637 are smaller in size than the computing tile memory 638.

In some embodiments, the instruction cache 635 can store and/or buffer messages and/or commands transferred between the RISC device 636 to the computing tile memory 638, while the data cache 637 can store and/or buffer data transferred between the computing tile memory 638 and the RISC device 636.

Figure 7:
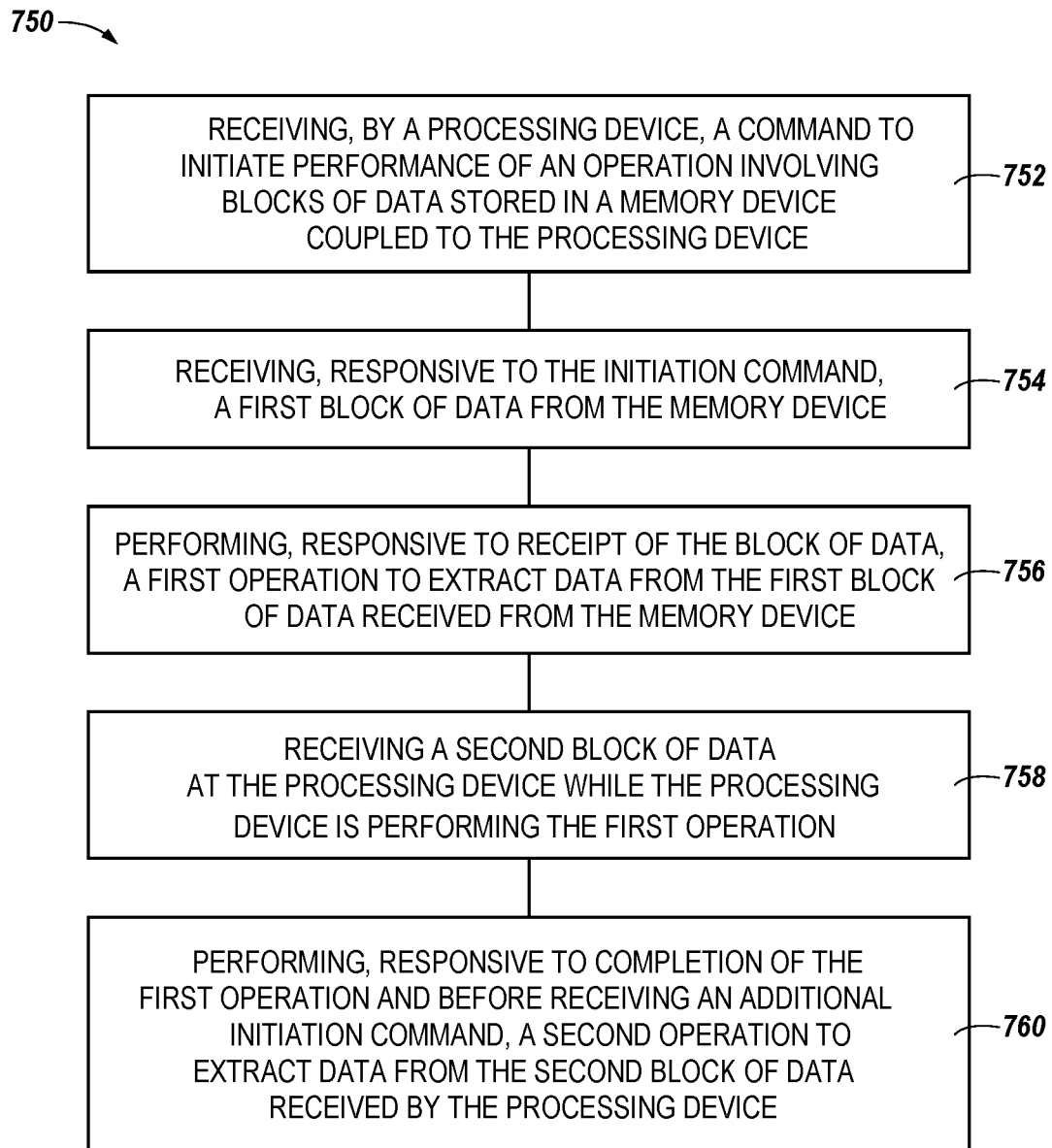
FIG. 7 is a flow diagram representing an example method for storage device operation orchestration in accordance with a number of embodiments of the present disclosure.

FIG. 7 is a flow diagram representing an example method 750 for storage device operation orchestration in accordance with a number of embodiments of the present disclosure. At block 752, the method 750 can include receiving, by a processing device (e.g., a processing device corresponding to a computing tile), a command to initiate performance of an operation involving blocks of data stored in a memory device coupled to the computing tile. The processing device can be a processing device such as the RISC computing device 536/636 illustrated in FIGS. 5 and 6, herein, and can be part of a computing tile such as computing tiles 110, 210, 310, 410, 510, and 610 illustrated in FIGS. 1-6, herein. The memory device can be analogous to the memory device(s) 116-1, . . . , 116-N illustrated in FIG. 1, herein. In some embodiments, the command to initiate performance of the operation can be generated by an orchestration controller such as the orchestration controller 106, 206, 306, or 406 illustrated in FIGS. 1-4, herein.

At block 754, the method 750 can include receiving, responsive to the initiation command, a first block of data from the memory device at the computing tile (e.g., from a memory resource coupled to a processing device of the computing tile). In some embodiments, the first block of data can be transferred from the memory device to the storage controller using a media controller such as the media controller 112, 212, 312, or 412 illustrated in FIGS. 1-4, herein. As described above, in some embodiments, receiving the command to initiate performance of the operation can include receiving the command to initiate performance of the operation by a processing device, such as the RISC device 536 and 636 illustrated in FIGS. 5 and 6, corresponding to the computing tile.

At block 756, the method 750 can include performing, responsive to receipt of the block of data, a first operation to extract data from the first block of data received by the processing device and/or the computing tile. In some embodiments, performing the first operation can include performing the first operation by a memory resource (e.g., the computing tile memory 538 and 638 illustrated in FIGS. 5 and 6, herein) corresponding to the processing device and/or the computing tile. In some embodiments, performing the first operation to extract data from the first block of data can include storing the first block of data in a first partition of a memory resource of the computing tile (e.g., in a memory resource coupled to the processing device) and/or selectively transferring a portion of data associated with the first block of data to a second partition of the memory device. The portion of data can include the data to be extracted from the block of data. Stated differently, the portion of data can include data that has been filtered such that relevant data is retained and irrelevant data is discarded due to performance of the operation.

At block 758, the method 750 can include receiving a second block of data from the memory device at the processing device of the computing tile while the computing tile is performing the first operation. In some embodiments, the second block of data can be transferred from the memory device to the storage controller using a media controller such as the media controller 112, 212, 312, or 412 illustrated in FIGS. 1-4, herein.

At block 760, the method 750 can include performing, responsive to completion of the first operation, a second operation to extract data from the second block of data received by the processing device of the computing tile without receiving an additional initiation command. For example, as described above, the computing tile can operate in a data driven manner such that blocks of data are streamed and processed through the processing device and/or the computing tile in the absence of additional commands after the initiation command is received by the processing device of the computing tile. In some embodiments, performing the second operation can include performing the second operation by a memory resource corresponding to the computing tile (e.g., a memory resource coupled to the processing device of the computing tile).

The method 750 can further include buffering, by the processing device of the computing tile, the second block of data prior to performance of the second operation such that the second block of data is available to the computing tile to perform the second operation upon completion of the first operation. The buffering can be performed by a buffer resident on the computing tile such as the DMA buffer 539 and 639 illustrated in FIGS. 5 and 6, herein.

The method 750 can further include transferring the data extracted from the first block of data to circuitry external to the processing device and/or the computing tile in response to completion of the operation to extract data from the first block of data. In some embodiments, a logical record corresponding to the extracted data can be transferred to the circuitry external to the processing device and/or the computing tile. For example, the method 750 can include generating a logical record corresponding to at least one of the data extracted from the first block of data and the second block of data and transferring the logical word to circuitry external to the computing tile, as described above in connection with FIGS. 2 and 3.

In some embodiments, the method can include requesting, by the processing device of the computing tile, information stored in an address space of a computing tile different than the computing tile and/or transferring the requested information from the computing tile different than the computing tile to the computing tile. For example, as described above in connection with FIGS. 4A-4C, the computing tiles can be configured that address spaces of the computing tiles are visible to other computing tiles in a storage controller.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
  a computing tile comprising a processing device and a memory resource, wherein the computing tile is configured to:
    receive a command to initiate an operation to reduce a size of a block of data from a first size to a second size;
    responsive to receipt of the command, receive a block of data comprising a plurality of columns of data from a memory device coupled to the apparatus; and
    responsive to receipt of the block of data, perform an operation on the block of data to extract predetermined data from the block of data by removing at least one column of data from among the plurality of columns of data to reduce a size of the block of data from a first size to a second size.

2. The apparatus of claim 1, wherein the computing tile is configured to perform the operation on the block of data responsive to receipt of the block of data in the absence of an intervening command.

3. The apparatus of claim 1, wherein the computing tile is further configured to receive an interrupt message as part of the command to initiate the operation.

4. The apparatus of claim 1, wherein the computing tile is further configured to cause the reduced size block of data to be transferred to circuitry external to the computing tile.

5. The apparatus of claim 1, wherein the computing tile further comprises a direct media access (DMA) buffer to receive a subsequent block of data during performance of the operation on the block of data, and wherein the computing tile is configured to perform a subsequent operation on the subsequent block of data to extract predetermined data from the subsequent block of data to reduce a size of the subsequent block of data from a first size to a second size in the absence of receipt of an intervening command to initiate the subsequent operation.

6. The apparatus of claim 5, wherein the computing tile is configured to cause the reduced size subsequent block of data to be transferred to circuitry external to the computing tile in the absence of receipt of an intervening command by the computing tile.

7. The apparatus of claim 1, wherein the processing device comprises a reduced instruction set computing device.

8. An apparatus, comprising:
a memory resource coupled to the processing device and inbound buffering circuitry; and
a processing device coupled to queuing circuitry and outbound buffering circuitry, wherein the processing resource is configured to:
receive, via the queuing circuitry, a command to initiate an operation to reduce respective sizes of blocks of data by selectively removing at least one column of data from the blocks of data;
cause a first block of data comprising a plurality of columns of data to be loaded into the memory resource from the inbound buffering circuitry;
cause the memory resource to perform the operation on the first block of data;
cause a second block of data to be loaded into the inbound buffering circuitry;
cause the second block of data to be loaded into the memory resource from the inbound buffering circuitry; and
responsive to a determination that the operation on the first block of data is complete, cause the memory resource to perform the operation on the second block of data.

9. The apparatus of claim 8, wherein the processing device is further configured to cause the second block of data to be loaded into the inbound buffering circuitry, loaded into the memory resource, and cause the memory resource to perform the operation on the second block of data in the absence of an additional command separate from the command to initiate the operation.

10. The apparatus of claim 8, wherein, as part of the operation, the memory resource is configured to:
store the first block of data in a first partition of the memory resource;
transfer a relevant portion of the first block of data to a second partition of the memory resource; and
transfer the data stored in the second partition to the outbound buffering circuitry.

11. The apparatus of claim 8, wherein the command to initiate the operation includes an interrupt message.

12. The apparatus of claim 8, wherein the first block of data or the second block of data includes data corresponding to a database, and wherein the operation comprises a filtering operation to extract particular columns of data from the first block of data or the second block of data.

13. The apparatus of claim 8, wherein the processing device is configured to cause, subsequent to performance of the operation, at least one of a first resultant block of data and a second resultant block of data to be:
transferred to the outbound buffering circuitry; and
transferred from the outbound buffering circuitry to circuitry external to the apparatus.

14. The apparatus of claim 13, wherein the processing device is configured to cause the at least one of the first resultant block of data and the second resultant block of data to be:
transferred to the outbound buffering circuitry; and
transferred from the outbound buffering circuitry to circuitry external to the apparatus in the absence of an additional command separate from the command to initiate the operation.

15. A system, comprising:
a plurality of computing tiles each comprising a respective memory resource and a respective reduced instruction set computing (RISC) device, wherein computing tiles among the plurality of computing tiles are configured to:
receive respective streams of data comprising a plurality of blocks of data comprising respective columns of data; and
perform operations on the blocks of data to remove at least one column of data from the plurality of blocks of data to extract requested portions of the blocks of data by transferring portions of the blocks of data between partitions of the respective memory resources.

16. The system of claim 15, further comprising a communication subsystem coupled to the plurality of computing tiles, wherein the communication subsystem is configured to provide communications pathways between the plurality of computing tiles to allow a first computing tile among the plurality of computing tiles to access an address space associated with a second computing tile among the plurality of computing tiles.

17. The system of claim 15, further comprising a controller coupled to the computing tiles, wherein the controller is configured to allocate particular computing tiles among the plurality of computing tiles to perform the operations on the blocks of data.

18. The system of claim 15, wherein the computing tiles are configured to initiate the operations on the blocks of data in response to receipt of an initiation command, and wherein the computing tiles are configured to receive the respective streams of data and perform the operations on the blocks of data in the absence of a command subsequent to the initiation command.

19. The system of claim 15, wherein the computing tiles are configured to transfer the blocks of data that include the extracted requested portions of data to circuitry external to the computing tiles in response to completion of the operation to extract the requested data.

20. The system of claim 15, wherein the computing tiles further comprise respective direct media access (DMA) buffering components configured to:
buffer subsequent blocks of data received as part of the respective streams of data while the operations are performed on preceding blocks of data; and
cause the subsequent blocks of data to be transferred to the respective memory resources in response to completion of the operations on the preceding blocks of data.

21. A method, comprising:
receiving, by a processing device, a command to initiate performance of an operation involving blocks of data comprising respective columns of data stored in a memory device coupled to the processing device;
receiving, responsive to the initiation command, a first block of data from the memory device;

performing, responsive to receipt of the block of data, a first operation to remove at least one column of data from the respective columns of data corresponding to the first block of data to extract data from the first block of data received from the memory device;

receiving a second block of data from the memory device at the processing device while the processing device is performing the first operation;

performing, responsive to completion of the first operation and before receiving an additional initiation command, a second operation to remove at least one column of data from the respective columns of data corresponding to the second block of data to extract data from the second block of data received by the processing device.

22. The method of claim 21, further comprising buffering, by buffer circuitry coupled to the processing device, the second block of data prior to performance of the second operation such that the second block of data is available to processing device to perform the second operation upon completion of the first operation.

23. The method of claim 21, further comprising:
requesting, by the processing device, information stored in an address space of a processing device different than the processing device;
transferring the requested information from the processing device different than the processing device to the processing device.

24. The method of claim 21, wherein performing the first operation and the second operation includes performing the first operation and the second operation within a memory resource coupled to the processing device.

25. The method of claim 21, further comprising transferring the data extracted from the first block of data to circuitry external to the processing device in response to completion of the operation to extract data from the first block of data.

26. The method of claim 21, wherein performing the first operation to extract data from the first block of data further comprises:
storing the first block of data in a first partition of a memory resource coupled to the processing device; and
selectively transferring a portion of data associated with the first block of data to a second partition of the memory device, wherein the portion of data includes the data to be extracted from the block of data.

27. The method of claim 21, further comprising:
generating a logical record corresponding to at least one of the data extracted from the first block of data and the second block of data; and
transferring the logical record to circuitry external to the processing device.

* * * * *